(12) United States Patent
Xiong

(10) Patent No.: US 12,133,301 B2
(45) Date of Patent: Oct. 29, 2024

(54) LED LAMP LIGHTING SYSTEM AND DIMMER AND LED LAMP INCLUDED THEREIN

(71) Applicant: JIAXING SUPER LIGHTING ELECTRIC APPLIANCE CO., LTD, Jiaxing (CN)

(72) Inventor: Aiming Xiong, Jiaxing (CN)

(73) Assignee: Jiaxing Super Lighting Electric Appliance Co., Ltd., Zhejiang (CN)

( * ) Notice: Subject to any disclaimer, the term of this patent is extended or adjusted under 35 U.S.C. 154(b) by 218 days.

(21) Appl. No.: 17/786,011

(22) PCT Filed: Dec. 11, 2020

(86) PCT No.: PCT/CN2020/135540
§ 371 (c)(1),
(2) Date: Jun. 16, 2022

(87) PCT Pub. No.: WO2021/121136
PCT Pub. Date: Jun. 24, 2021

(65) Prior Publication Data
US 2023/0034364 A1 Feb. 2, 2023

(30) Foreign Application Priority Data

Dec. 16, 2019 (CN) .......................... 201911292542.X

(51) Int. Cl.
*H05B 45/10* (2020.01)
*G01R 19/175* (2006.01)
(Continued)

(52) U.S. Cl.
CPC ............ *H05B 45/10* (2020.01); *G01R 19/175* (2013.01); *H03K 5/1252* (2013.01); *H05B 45/3577* (2020.01); *H05B 47/175* (2020.01)

(58) Field of Classification Search
CPC ...... H05B 39/02; H05B 39/04; H05B 39/041; H05B 41/36; H05B 41/38; H05B 45/10;
(Continued)

(56) References Cited

U.S. PATENT DOCUMENTS 8,593,129 B2 * 11/2013 Gaknoki ........... H02M 3/33507
323/241
2018/0359836 A1 * 12/2018 Saveri, III ............. H05B 47/11

FOREIGN PATENT DOCUMENTS

CN 103428962 A 12/2013
CN 103917022 A 7/2014
(Continued)

*Primary Examiner* — Long Nguyen
(74) *Attorney, Agent, or Firm* — Muir Patent Law, PLLC

(57) ABSTRACT

The present disclosure relates to a dimmable LED lamp illumination system. The dimmable LED lamp illumination system includes: a dimmer and an LED lamp. The dimmer is connected in series between a power input end and the LED lamp, and is used for loading a digital dimming signal onto a power signal, so as to generate a dimming power signal. The LED lamp receives the dimming power signal, demodulates the digital dimming signal, and adjusts the brightness of the LED lamp based on the demodulated digital dimming signal. By using the dimmable LED lamp illumination system of the present disclosure, the deployment of a dimming system is simpler, and the transmission of a digital dimming signal is more stable.

24 Claims, 9 Drawing Sheets

(51) Int. Cl.
*H03K 5/1252* (2006.01)
*H05B 45/3577* (2020.01)
*H05B 47/175* (2020.01)

(58) Field of Classification Search
CPC .. H05B 45/30; H05B 45/357; H05B 45/3574;
H05B 45/3577; H05B 47/10; H05B
47/105; H05B 47/11; H05B 47/175;
H03K 5/125; H03K 5/1252; G01R
19/165; G01R 19/16566; G01R 19/16571;
G01R 19/16576; G01R 19/175
See application file for complete search history.

(56) References Cited

FOREIGN PATENT DOCUMENTS

| | | |
|---|---|---|
| CN | 204887539 U | 12/2015 |
| JP | 6513546 B2 | 5/2019 |

\* cited by examiner

LED LAMP LIGHTING SYSTEM AND DIMMER AND LED LAMP INCLUDED THEREIN

TECHNICAL FIELD

The present disclosure relates to the field of LED lighting, and in particular, to an LED lamp lighting system that uses digital signals for dimming.

BACKGROUND

In the field of lighting, with the advantages of high luminous efficiency and long working life, LED lamps have gradually replaced traditional incandescent lamps and fluorescent lamps and have become the main lighting products on the market.

Traditional incandescent lamps can adjust the brightness of the lamp through a silicon-controlled rectifier, such as a bidirectional triode thyristor (TRIAC), but when the silicon-controlled rectifier is used in an LED lamp, although there is no need to connect an additional dimming signal line, due to the non-linear characteristics of the LED, under low brightness, problems such as LED lights flickering may arise, and the efficiency of LED lights adjusted by silicon-controlled rectifier is also poorer.

There are many types of LED lights on the market, and current silicon-controlled rectifier dimmers cannot be 100% compatible with LED lights.

The digital wired dimming solution DLT (Digital Load Side Transmission) based on the power line carrier communication protocol bypasses the silicon-controlled rectifier from the physical mechanism, thereby solving the compatibility problem of LED lamps and dimming switches (or dimmers). The compatibility between LED DLT dimming lamps and DLT dimming switches of different brands can reach 100% and with no flickering issues, the dimming is smooth and noiseless, and the minimum dimming depth can be reached to 1%. The cost is comparable to the silicon-controlled rectifier solution and the market development potential can be expected.

Although DLT has great market potential, since the disclosure of the DLT agreement, due to the difficulty in the development of DLT dimming lamps, there is no mature solutions have appeared on the market. There are some resistances to the real large-scale promotion and disclosure of DLT dimming technology.

SUMMARY

The purpose of this disclosure is to use a digital dimming lighting system to solve the problems mentioned in the background above.

The embodiment of the disclosure can be implemented with the following technical solution: the digital dimming lighting system includes a dimmer and an LED lamp. The dimmer is electrically connected between the external power input end and the LED lamp to load the dimming signal onto the power signal to generate a dimming power signal. The LED lamp is electrically connected to the dimmer, receives the dimming power signal and demodulates the dimming power signal to obtain the dimming information included in the dimming power signal. The brightness or color of the LED lamp is adjusted based on the dimming information.

The disclosure provides a dimmer, connected in series with a power supply circuit, characterized in that the dimmer is provided with an external power input end and an output end of the dimmer, configured to convert a dimming configuration information into a digital dimming signal and generate a dimming power signal by loading the digital dimming signal onto an external power signal in form of changing a waveform of an AC power of mains electricity, the external power input end is electrically connected to one end of the AC power of the mains electricity, and the dimmer output end is configured to output the dimming power signal.

In an embodiment of the present disclosure, the dimmer includes: a dimming signal generating module, electrically connected to a control module, and is configured to convert the dimming configuration information into the digital dimming signal; a zero-crossing detection module, electrically connected to the external power input end and the output end of the dimmer, configured to detect a zero-crossing point in the external power signal and generate a zero-crossing signal; a data modulation module, electrically connected to the external power input end, configured to rectify the external power signal to generate a rectified signal and load the digital dimming signal on the external power signal to generate the dimming power signal; a filtering circuit, electrically connected to the data modulation module, configured to receive the rectified signal, and perform filtering to generate a filtered signal; a power supply module, electrically connected to the filtering circuit, configured to receive the filtered signal, perform a power conversion, and generates a power supply signal to be supplied to the dimmer; and a control module, electrically connected to the zero-crossing detection module, configured to receive the zero-crossing signal, start a data modulation at a specific time period after a zero-voltage point, and load the received digital dimming signal to the external power signal to generate the dimming power signal, wherein the specific time period is from T/4 to T/2 after crossing the zero-voltage point, and T is the period of the external power signal.

In an embodiment of the present disclosure, the dimming signal generating module comprises a wireless remote controller and a signal receiving module, and the wireless remote controller is configured to convert the dimming configuration information into a wireless dimming signal, and the signal receiving module is configured to receive the wireless dimming signal and convert the wireless dimming signal into the digital dimming signal.

In an embodiment of the present disclosure, the dimming signal generating module further comprises a light sensing module, and the light sensing module generates the digital dimming signal based on an intensity of ambient light.

In an embodiment of the present disclosure, wherein the dimming signal generating module comprises a first variable resistor, a first resistor and a first capacitor; a first pin of the first variable resistor is electrically connected to a first voltage source, a second pin of the first variable resistor is electrically connected to a ground end, and a third pin of the first variable resistor is electrically connected to a first pin of the first resistor pin; a first pin of the first capacitor is electrically connected to a second pin of the first resistor and is electrically connected to the output end of the dimming signal generating module, and a second pin of the first capacitor is electrically connected to the ground end.

In an embodiment of the present disclosure a first diode, an anode of the first diode is electrically connected to the data modulation module, and a cathode of the first diode is electrically connected to the filtering circuit.

In an embodiment of the present disclosure, the filtering circuit comprises a second capacitor, a first pin of the second capacitor is electrically connected to the cathode of the first diode, and a second pin of the second capacitor is electrically connected to the ground end.

In an embodiment of the present disclosure, the filtering circuit further comprises a third capacitor and a first inductor; a first pin of the first inductor is electrically connected to the cathode of the first diode, a second pin of the first inductor is electrically connected to a first pin of the third capacitor; and a second pin of the third capacitor is electrically connected to the ground end.

In an embodiment of the present disclosure, the power supply module comprises a controller, a switch circuit and an energy storage circuit; the controller generates a control signal, and the switch circuit is turned conducted/cut-off in response to the control signal, and the energy storage circuit is repeatedly charged/discharged based on the conducted/cut-off of the switch circuit.

In an embodiment of the present disclosure, the power supply module further comprises a second diode, a fourth capacitor, an operational amplifier, a second resistor and a third resistor, and the switch circuit comprises a first transistor, the energy storage circuit includes a second inductor; a second pin of the first transistor is electrically connected to a first output end of the filtering circuit, a third pin of the first transistor is electrically connected to a first pin of the second inductor, and a first pin of the first transistor is electrically connected to the controller; a second pin of the second inductor is electrically connected to a first output end of the power supply module, a cathode of the second diode is electrically connected to the first pin of the second inductor, and the anode the second diode is electrically connected to a second output end of the filtering circuit; a first pin of the second resistor is electrically connected to the second pin of the second inductor, a second pin of the second resistor is electrically connected to a first pin of the third resistor, and a second pin of the third resistor is electrically connected to a second output end of the power supply module; a first pin of the fourth capacitor is electrically connected to the second pin of the second inductor, and the second pin of the fourth capacitor is electrically connected to the second output end of the power supply module; an inverting input end of the operational amplifier is electrically connected to the second pin of the second resistor, a non-inverting input end of the operational amplifier is electrically connected to a reference voltage, and an output end of the operational amplifier is electrically connected to the controller; and the second output end of the filtering circuit is electrically connected to the second output end of the power supply module.

In an embodiment of the present disclosure, the zero-crossing detection module comprises a fourth resistor, a fifth resistor, a sixth resistor, a seventh resistor, a fifth capacitor, a sixth capacitor, a first Zener diode and a second Zener diode; a first pin of the fourth resistor is electrically connected to the external power input end, a second pin of the fourth resistor is electrically connected to a first output end of the zero-crossing detection module, the first pin of the fifth resistor is electrically connected to the second pin of the fourth resistor, a second pin of the fifth resistor is electrically connected to a first circuit node, a first pin of the fifth capacitor is electrically connected to the second pin of the fourth resistor, a second pin of the fifth capacitor is electrically connected to the first circuit node, an anode of the first Zener diode is electrically connected to the first circuit node, and the cathode of the first Zener diode is electrically connected to the first output end of the zero-crossing detection module; and a first pin of the sixth resistor is electrically connected to the output end of the dimmer, a second pin of the sixth resistor is electrically connected to a second output end of the zero-crossing detection module, a first pin of the seventh resistor is electrically connected to the second pin of the sixth resistor, a second pin of the seventh resistor is electrically connected to the first circuit node, a first pin of the sixth capacitor is electrically connected to the first pin of the sixth resistor, a second pin of the sixth capacitor is electrically connected to the first circuit node, an anode of the second Zener diode is electrically connected to the first circuit node, and a cathode of the second Zener diode is electrically connected to the second output of the zero-crossing detection module.

In an embodiment of the present disclosure, the data modulation module comprises a third diode, a fourth diode, a third Zener diode, a second transistor, a third transistor and a fourth transistor; an anode of the third diode is electrically connected to the external power input end and the first pin of the second transistor, and the cathode of the third diode is electrically connected to a cathode of the fourth diode and a cathode of the third Zener diode; a second pin of the second transistor and a second pin of the third transistor are electrically connected and are further electrically connected to the first circuit node, and the third pin of the second transistor is electrically connected to the control module; a first pin of the third transistor is connected to an anode of the fourth diode and is electrically connected to the output end of the dimmer, the third pin of the third transistor is electrically connected to the control module; and a first pin of the fourth transistor is electrically connected to an anode of the third Zener diode, a second pin of the fourth transistor is electrically connected to a third pin of the third transistor, and the third pin of the fourth transistor is electrically connected to the control module.

In an embodiment of the present disclosure, the external power signal is a mains electricity alternating current, and within an alternating current half-wave (within half an alternating current cycle), the data modulation module includes three working stages: a supply stage, power stage and a data stage.

In an embodiment of the present disclosure in the supply stage, the external power signal is provided as power supply to the dimmer, and in the power stage, the external power signal is provided as power supply to an LED lamp, and in the data stage, the dimmer loads the digital dimming signal onto the external power signal to generate the dimming power signal.

In an embodiment of the present disclosure, during the power supply state, the second transistor and the third transistor are in a cut-off state.

In an embodiment of the present disclosure, during the power stage, the second transistor and the third transistor are in a conducting state.

In an embodiment of the present disclosure, in the data stage, the second transistor and the third transistor are operated in an amplification region, and the fourth transistor is turned on intermittently.

This disclosure provides an LED lamp, which includes a rectifier circuit, a filtering circuit, a driving circuit, an LED module and a dimming signal demodulation module, and is disposed with a first input end and a second input end; the first input end is electrically connected to an output end of dimmer, and the second input end is electrically connected to an external power signal input end; the rectifier circuit is electrically connected to the first input end and the second input end, and is configured to receive and rectify an external power signal to generate a rectified signal; the filtering circuit is electrically connected to the rectifier circuit and is configured to receive and filter the rectified signal to generate a filtered signal; the dimming signal demodulation module is electrically connected to the first input end and the second input end, and is configured to demodulate the dimming information comprised in the external power signal and convert the dimming information into a dimming driving signal; the driving circuit is electrically connected to the filtering circuit and the dimming signal demodulation module, and is configured to receive the filtered signal and perform a power conversion to generate a lighting signal, and adjusting the lighting signal based on the dimming driving signal; and the LED module is electrically connected to the driving circuit and is configured to receive the lighting signal to light up.

In an embodiment of the present disclosure, the rectifier circuit is a full-bridge rectifier circuit.

In an embodiment of the present disclosure, the rectifier circuit includes a fifth diode, a sixth diode, a seventh diode and an eighth diode; an anode of the fifth and an anode of the sixth diode are electrically connected and are further electrically connected to an second output end of the rectifier circuit, a cathode of the seventh diode and a cathode of the eighth diode are electrically connected and are further electrically connected to the first output end of the rectifier circuit, a cathode of the fifth diode and a anode of the seventh diode are electrically connected and are further electrically connected to the first input end, and a cathode of the sixth diode and the anode of the eighth diode are electrically connected and are further electrically connected to the second input end.

In an embodiment of the present disclosure, the filtering circuit includes a seventh capacitor, a first pin of the seventh capacitor is electrically connected to the first output end of the rectifier circuit, and the second pin of the seventh capacitor is electrically connected to the second output end of the rectifier circuit.

In an embodiment of the present disclosure, the filtering circuit further includes an eighth capacitor and a third inductor; a first pin of the third inductor is electrically connected to the first pin of the seventh capacitor, a second pin of the third inductor and a first pin of the eighth capacitor are electrically connected and are further electrically connected to the first output end of the filtering circuit, and a second pin of the eighth capacitor and a second pin of the seventh capacitor are electrically connected and are furtherer electrically connected to the second output end of the filtering circuit.

In an embodiment of the present disclosure, the driving circuit includes the driving circuit comprises a controller, a switch circuit and an energy storage circuit; the control circuit generates a control signal, the switch circuit is turned conducted/cut-off in response to the control signal, the energy storage circuit is repeatedly charged/discharged based on the conducted/cut-off of the switch circuit.

This disclosure provides an LED lamp lighting system, which includes: the dimmer of any one of the above-described embodiments, wherein the external power input end of the dimmer is electrically connected to one end of the mains electricity alternating current; and the LED lamp of any one of the above-described embodiments, wherein the first input end of the LED lamp is electrically connected to the output end of the dimmer, and the second input end of the LED lamp is electrically connected to another end the mains electricity alternating current.

In an embodiment of the present disclosure, the LED lamp lighting system includes a plurality of LED lamps, and the plurality of LED lamps are connected in parallel.

The brightness or color adjustment of the LED lamp can be conveniently realized by the dimmer and the LED lamp provided in the the present disclosure. The dimmer can be configured with single live wire, which is convenient for the deployment of the dimmer and the upgrade of the traditional lighting system.

DESCRIPTION OF DRAWINGS

Like reference symbols in the various drawings indicate like elements.

DETAILED DESCRIPTION

The technical solution of the present disclosure provides a new digital wired dimming lighting system to solve the problems mentioned in the background section. In order to make the technical solution achieve the above-mentioned objectives, features and advantages more obvious and easy to understand, the specific embodiments of the proposed technical solution will be described in detail below with reference to the accompanying drawings. The following descriptions of the embodiments of the technical solutions of the present disclosure are only for illustration and are illustrative, and are not meant to be all the embodiments of the present disclosure or limit the present disclosure to specific embodiments. Based on the embodiments in this disclosure, all other embodiments obtained by those of ordinary skill in the art without creative work should fall within the protection scope of this disclosure.

It should be noted that when an element is referred to as being "disposed on" another element, it can be directly on the other element, or a central element may also be present. When an element is considered to be "connected" to another element, it can be directly connected to the other element, or an intermediate element may be present at the same time. The terms "vertical", "horizontal", "left", "right" and similar expressions used herein are for illustrative purposes only, and do not mean that they are the only embodiments.

Unless otherwise defined, all technical and scientific terms used herein have the same meaning as commonly understood by those skilled in the technical field of the present disclosure. The terminology used in the description of the present disclosure herein is only for the purpose of describing specific embodiments, and is not intended to limit the present disclosure. The term "and/or" as used herein includes any and all combinations of one or more related listed items.

A single resistor in the circuit diagram can be equivalently replaced by multiple resistors in series or in parallel in the actual circuit, and the present disclosure is not limited to this. The capacitor can also be equivalently replaced by multiple capacitors in series or in parallel.

Figure 1A:
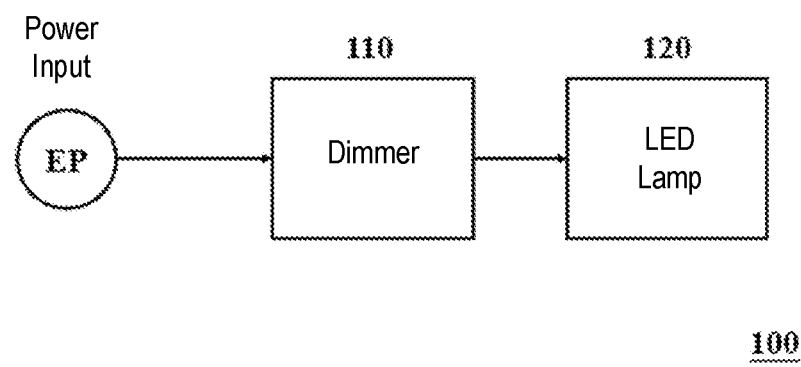
FIG. 1A is a schematic diagram of functional modules of a LED lighting system in accordance with the first embodiment of the present disclosure.

Refer to FIG. 1A for is a schematic diagram of functional modules of a LED lighting system in accordance with the first embodiment of the present disclosure. The LED lighting system 100 includes a dimmer 110 and an LED lamp 120. The dimmer 110 is connected between the power input EP and the LED lamp to convert the dimming configuration information into a digital dimming signal, and load the digital dimming signal onto the power transmission line to generate a dimming power signal. The LED lamp 120 is electrically connected to the dimmer 110 to receive the dimming power signal, demodulate the dimming information from the dimming power signal, and adjust the brightness or color of the LED lamp based on the demodulated dimming information.

The dimming information includes information regarding adjusting color or brightness or other information regarding adjusting scene modes of the LED lamp.

In some embodiments, a switch module (not shown) can be disposed on the power supply path between the power input EP and the dimmer 110 or between the dimmer 110 and the LED lamp 120, which can be used to control the on and off of the light, similar to the switch of a traditional lighting lamp. In other embodiments, the switch module can also be disposed inside the dimmer 110.

Figure 1B:
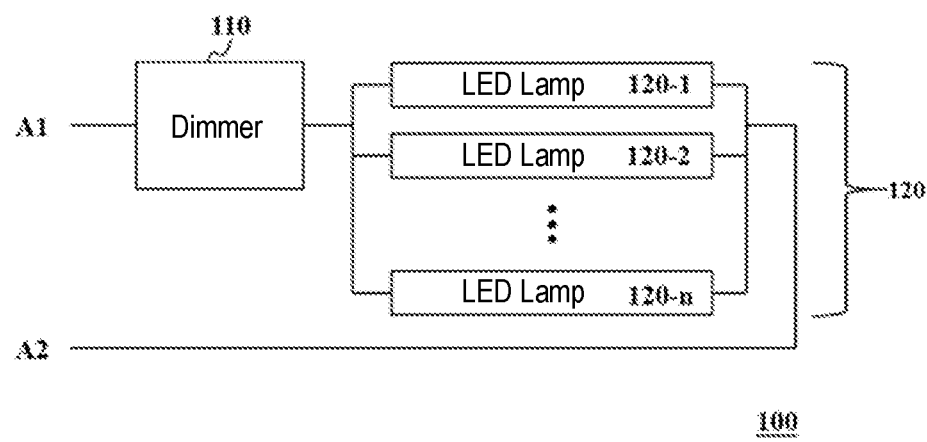
FIG. 1B is a schematic diagram of an application scenario of a LED lighting system in accordance with the first embodiment of the present disclosure.

Refer to FIG. 1B for a schematic diagram of an application scenario of a LED lighting system in accordance with the first embodiment of the present disclosure. The LED lighting system 100 includes a dimmer 110 and an LED lamp 120. The dimmer 110 is connected between the power input end A1 and the LED lamp 120 to convert the dimming configuration information into the digital dimming signal, and the digital dimming signal is loaded on the power signal to generate a dimming power signal. The LED lamp 120 includes multiple lamps such as the LED lamp 120-1 and the LED lamp 120-2. The LED lamp 120 receives the dimming power signal output by the dimmer 110, and demodulates the digital dimming signal contained in the dimming power signal, and Based on this digital dimming signal, the brightness or color of the LED light is adjusted. The LED lights 120-1, 120-2 . . . 120-$n$ ($n$ is a positive integer greater than or equal to 1) can simultaneously receive the dimming power signal output by the dimmer 110, and adjust the brightness or color of the LED lights to achieve a dimming The purpose of adjusting multiple lights at the same time. In this embodiment, 120-1, 120-2 . . . 120-$n$ are LED lights with the same or similar configuration.

In this embodiment, one end of the dimmer 110 is electrically connected to the power input end A1, and the other end is connected to the LED lamp 120. Through this configuration, a single live wire can be utilized to achieve the purpose of dimming (also known as single live wire dimming). Since the traditional wall switch is usually also connected in series between the power input end A1 and the LED lamp 120, the dimmer 110 can directly replace the traditional wall switch to upgrade the existing lighting system without the need to rearrange the power line. The configuration of this embodiment can be used to conveniently upgrade the lighting system and the installation cost can be reduced thereby.

The LED lamp 120 in this embodiment can be any LED lamp that uses external power supply, such as an LED straight tube lamp, an LED down lamp, an LED ceiling lamp, and the like.

Figure 1C:
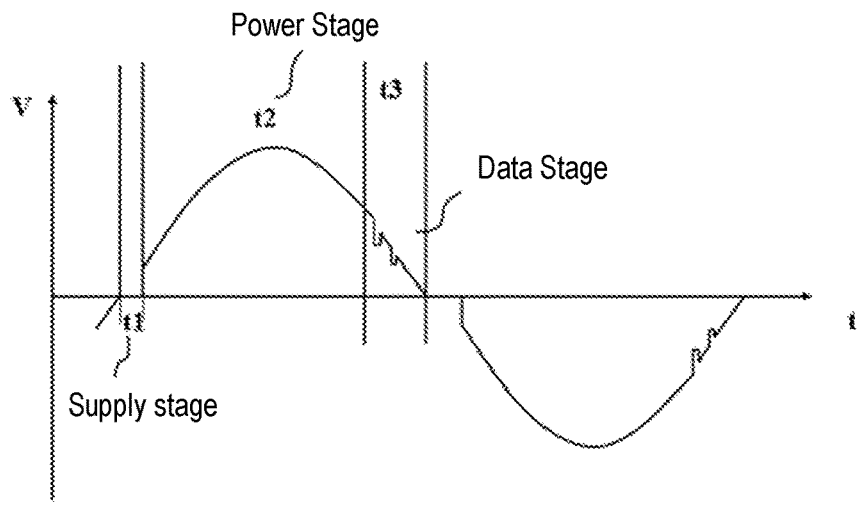
FIG. 1C is a schematic waveform diagram of a dimming power signal of the LED lighting system in accordance with the first embodiment of the present disclosure.

Refer to FIG. 1C for a schematic waveform diagram of a dimming power signal of the LED lighting system in accordance with the first embodiment of the present disclosure. An AC half wave can be divided into three stages. The supply stage t1 is configured to supply power to the control unit. The power stage t2 is configured to provide power for the LED lamp and light up the LED lamp. The data stage t3 is configured to load the dimming signal onto the power signal to generate the dimming power signal.

Figure 2A:
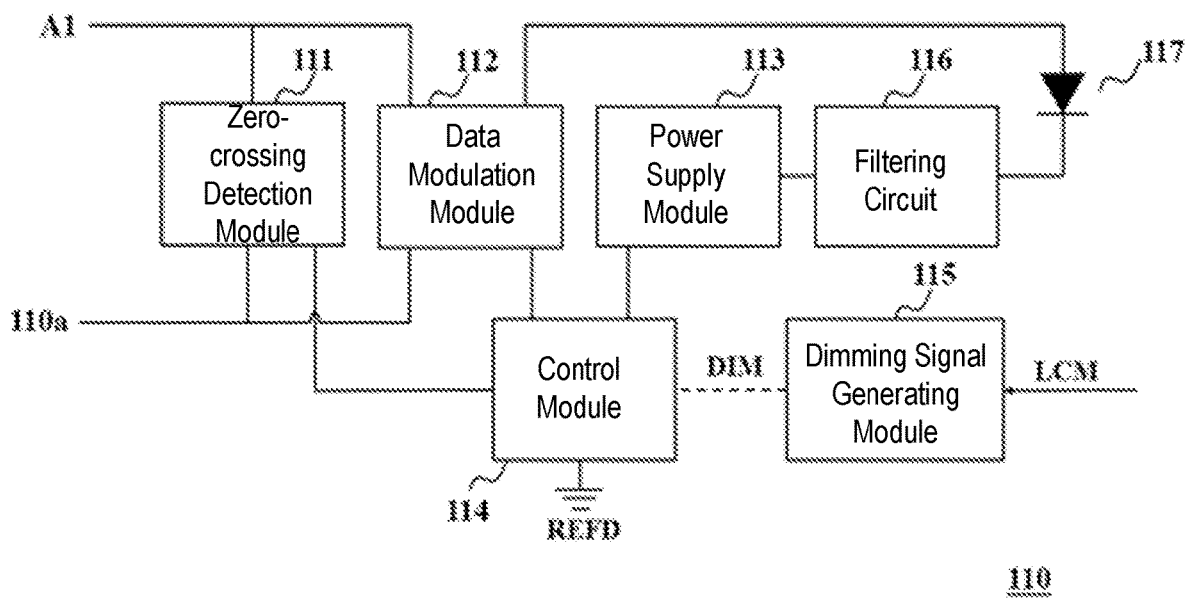
FIG. 2A is a schematic circuit block diagram of a dimmer in accordance with the first embodiment of the present disclosure.

Refer to FIG. 2A for a schematic circuit block diagram of a dimmer in accordance with the first embodiment of the present disclosure The dimmer 110 includes a zero-crossing detection module 111, a data modulation module 112, a power supply module 113, a control module 114, a dimming signal generating module 115, a filtering circuit 116 and a diode 117. The zero-crossing detection module 111 is electrically connected to the power input end A1, the dimmer output end 110$a$, and the control module 114 respectively. The zero-crossing detection module 111 collects the power signal from the power input end A1 and the dimmer output end 110$a$. When the waveform is converted from a positive half cycle to a negative half cycle or from a negative half cycle to a positive half cycle, during the zero potential is passed, a zero-crossing signal is generated, and the zero-crossing signal is sent to the control module 114. The data modulation module 112 is electrically connected to the power input end A1, the dimmer output end 110$a$, the control module 114, and the anode of the diode 117 respectively. The data modulation module 112 is controlled by the control module 114 to load the digital dimming signal DIM onto the power signal to generate a dimming power signal, and transmit the dimming power signal to the next stage through the dimmer output end 110$a$. The power supply module 113 is connected to the filtering circuit 116 and the control module 114 respectively. The power supply module 113 is configured to perform a power conversion on the received power signal to generate a power supply signal to be provided to the dimmer 110. The dimming signal generating module 115 is electrically connected to the control module 114. The dimming signal generating module 115 is configured to convert the dimming configuration information LCM into a digital dimming signal DIM and transmit the digital dimming signal DIM to the control module 114. The control module 114 receives the digital dimming signal DIM from the dimming signal generating module 115, and loads the digital dimming signal DIM onto the power signal through the data modulation module 112 to generate a dimming power signal. The control module 114 receives the zero-crossing signal from the zero-crossing detection module 111, and starts a data modulation operation at a specific time period after receiving the zero-crossing signal. The filtering circuit 116 is electrically connected to the data modulation module 112 through the diode 117, receives and filters the power signal processed by the data modulation module 112, generates a filtered signal, and transmits the filtered signal to the power supply module 113. The cathode of the diode 117 is electrically connected to the filtering circuit 116 to prevent the current of the filtering circuit 116 from flowing into the data modulation module 112 and cause interference to the data modulation module 112.

The control module 114 is electrically connected to the circuit node REFD, and the circuit node REFD can be referred as a reference electric potential node in the circuit.

In other embodiments, the dimming signal generating module 115 can include a wireless remote controller and a signal receiving module. The wireless remote controller is configured to convert the user-configured dimming information LCM into a wireless dimming signal and transmit wireless dimming signal to the signal receiving module. The signal receiving module receives the wireless dimming signal and converts the wireless dimming signal into the digital dimming signal DIM, where the digital dimming signal DIM includes the configured dimming information.

In some embodiments, the dimming signal generating module 115 can also include a light sensing module (not shown). The light sensing module is configured to receive ambient light and generate the digital dimming signal DIM based on the intensity of the ambient light, so as to realize the function of automatically adjusting the brightness of the LED lamp based on the ambient light.

Figure 3A:
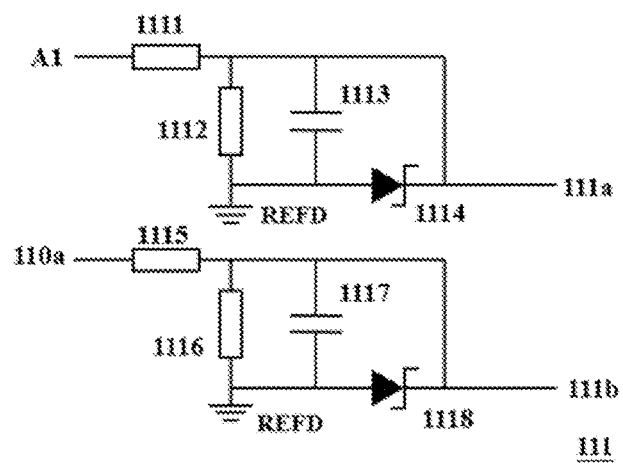
FIG. 3A is a schematic circuit diagram of a zero-crossing detection module in accordance with the first embodiment of the present disclosure.
Figure 4A:
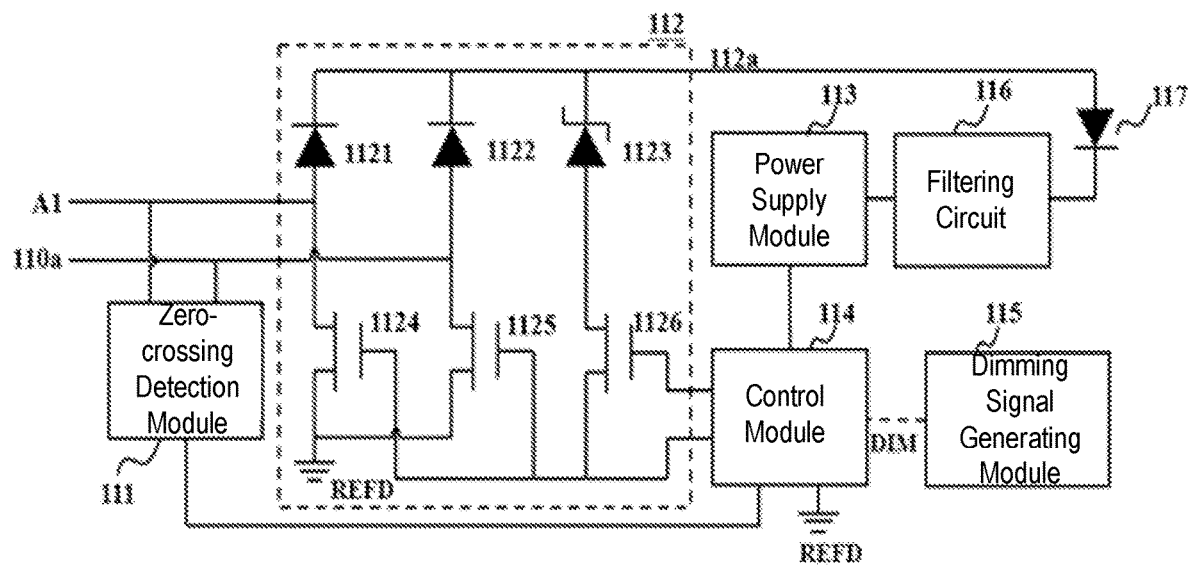
FIG. 4A is a schematic circuit diagram of a data modulation module in accordance with the first embodiment of the present disclosure.

Refer to FIG. 3A for a schematic circuit diagram of a zero-crossing detection module in accordance with the first embodiment of the present disclosure. The zero-crossing detection module 111 includes resistors 1111, 1112, 1115, and 1116, capacitors 1113 and 1117, and Zener diodes 1114 and 1118. The first pin of the resistor 1111 is electrically connected to the power input end A1, and the second pin of the resistor 1111 is electrically connected to the first pin of the resistor 1112. The second pin of the resistor 1112 is electrically connected to the circuit node REFD. The capacitor 1113 and the resistor 1112 are connected in parallel. The anode of the Zener diode 1114 is electrically connected to the circuit node REFD, and the cathode of the Zener diode 1114 is electrically connected to the zero-crossing detection module output end 111a, and the zero-crossing detection module output end 111a is electrically connected to the control module 114. The component configuration of the zero-crossing detection module 111 between the dimmer output end 110a and the zero-crossing detection module output end 111b is similar to the configuration between the power input end A1 and the zero-crossing detection module output end 111a. The first pin of the resistor 1115 is electrically connected to the dimmer output end 110a, and the second pin of the resistor 1115 is electrically connected to the first pin of the resistor 1116. The second pin of the resistor 1116 is electrically connected to the circuit node REFD. The capacitor 1117 is connected in parallel with the resistor 1116. The anode of the Zener diode 1118 is electrically connected to the circuit node REFD, the cathode of the Zener diode 1118 is electrically connected to the zero-crossing detection module output end 111b, and the zero-crossing detection module output end 111b is electrically connected to the control module 114.

The operation principle of the zero-crossing detection module 111 would be described below with FIG. 3A. Due to the series voltage division of the resistors 1111 and 1112, the voltage across the resistor 1112 is proportional to the voltage between the power input end A1 and the reference electric potential point REFD. The capacitor 1113 is configured to stabilize the voltage across the resistor 1112. The Zener diode 1114 is configured to limit the maximum voltage across the resistor 1112 to a predetermined value. The zero-crossing detection module output end 111a is configured to transmit the voltage signal on the resistor 1112 to the control module 114. Similar to the configuration between the power input end A1 and the zero-crossing detection circuit output end 111a, the zero-crossing detection module output end 111b also transmits the voltage on the resistor 1116 to the control module 114. Inside the control module 114, the zero-crossing detection module output end 111a is electrically connected to the non-inverting input end of a comparator, and the zero-crossing detection module output end 111b is electrically connected to the inverting input end of the comparator. In other embodiments, the comparator can also be disposed outside the control module 114. When the waveform at the power input end A1 changes from a negative half cycle to a positive half cycle, the electric potential at the zero-crossing detection module output end 111a is higher than the electric potential at zero-crossing detection module output end 111b, and the comparator outputs a high-level signal. When the waveform at the power input end A1 changes from a positive half cycle to a negative half cycle, the potential at the zero-crossing detection module output end 111a of the zero-crossing detection circuit is lower than the potential at zero-crossing detection module output end 111b, and the comparator outputs a low-level signal. The control circuit 114 determines the zero-crossing point by detecting the level change of the output end of the comparator.

Figure 5A:
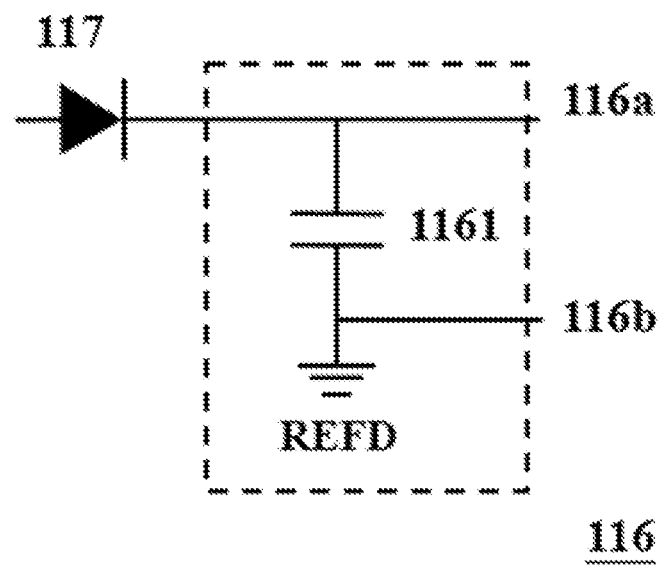
FIG. 5A is a schematic circuit diagram of a filtering circuit in accordance with the first embodiment of the present disclosure.

Refer to FIG. 5A for a schematic circuit diagram of a data modulation module in accordance with the first embodiment of the present disclosure. The data modulation module 112 includes diodes 1121, 1122, 1123, and 117, a Zener diode 1123, and MOS transistors 1124, 1125, and 1126. The anode of the diode 1121 is electrically connected to the power input end A1 and the first pin of the MOS transistor 1124. The cathode of the diode 1121, the cathode of the diode 1122 and the cathode of the Zener diode 1123 are electrically connected and are connected to the anode of the diode 117. The cathode of the diode 117 is electrically connected to the filtering circuit. The anode of the diode 1122 is electrically connected to the first pin of the MOS transistor 1125. The anode of the Zener diode 1123 is electrically connected to the first pin of the MOS transistor 1126. The second pin of the MOS transistor 1124 and the second pin of the MOS transistor 1125 are electrically connected and are electrically connected to the circuit node REFD. The third pin of the MOS transistor 1124, the third pin of the MOS transistor 1125, and the second pin of the MOS transistor 1126 are electrically connected and are electrically connected to the control module 114.

The operations of the data modulation module 112 in each circuit stage are described below with FIG. 1C.

In the supply stage t1, the data modulation module 112 can be configured as a rectifier circuit to rectify the received external power signal to generate a rectified signal. The filtering circuit 116 filters the rectified signal after receiving the rectified signal. The operation principle of the data modulation module 112 as a rectifier circuit would be described below. In the data stage, the MOS transistor 1124 and the MOS transistor 1125 do not received the enable signal and are in a cut-off state. The body diodes of the MOS transistor 1124 and the MOS transistor 1125, the diode 1121 and the diode 1122 together form a full-bridge rectifier circuit, which is able to rectify the received power signal to obtain the rectified signal. The anode of the body diode of the MOS transistor 1124 is electrically connected to the circuit node REFD, and the cathode of the body diode of the MOS transistor 1124 is electrically connected to the anode of the diode 1121. Similarly, the anode of the body diode of the MOS transistor 1125 is electrically connected to the circuit node REFD, and the cathode of the body diode of the MOS transistor 1125 is electrically connected to the anode of the diode 1122.

In the power stage t2, the third pin of the MOS transistor 1124 and the third pin of the MOS transistor 1125 receive the enable signal of the control module 114, the MOS transistor 1124 and the MOS transistor 1125 are closed and conducted, and the external power signal can be directly transmitted to the LED lamp 120 through the loop formed by the input end A1, the MOS transistor 1124, the MOS transistor 1125, and the dimmer output end 110a.

In the data stage t3, the data modulation module 112 acts as a modulation circuit to load the digital dimming signal DIM onto the power line. The control module 114 controls the MOS transistor 1126 to be conducted intermittently, and cooperates with the actions of the MOS transistor 1124 and the MOS transistor 1125 to load the digital dimming signal onto the power signal to generate a dimming power signal, which can be referred to the signal waveform of the data stage in FIG. 1C. In this embodiment, each half wave carries a group of data, and a group of data includes at least one digital signal. One pulse in the data stage t3 on the waveform diagram corresponds to a digital signal. The combination of multiple digital signals can be combined into dimming data. The dimming data is a digital signal, which can simultaneously carry brightness and color information, or other dimming information.

By utilizing the circuit characteristics of the MOS transistor in the data modulation module 112, the data modulation module 112 can implement different circuit functions in different circuit stages. In the supply stage t1, the MOS transistors 1124 and 1125 in the data modulation module 112 are in the cut-off state. The body diodes of the MOS transistors 1124 and 1125 and the diodes 1121 and 1122 form a full-bridge rectifier circuit to rectify the received power signal to generate the rectified signal; in the power stage t2, the MOS transistors 1124 and 1125 in the data modulation module 112 are in the conducting state, and the external power signal can be directly supplied to the LED lamp 120 through the power supply loop formed by the power input end A1, the MOS transistors 1124 and 1125 and the dimmer output end 110a; and in the data stage t3, the MOS transistors 1124 and 1125 in the data modulation module 112 work in the amplifying region, and the MOS transistor 1126 is driven to be conducted intermittently to generate a pulse signal on the power signal (refer to FIG. 1C). The pulse width of the pulse signal corresponds to the conducting time of the MOS transistor 1126. By utilizing the characteristics of the pulse signal to represent the 1 and 0 of the digital signals, the digital signals can be loaded on the power signal. The characteristics of the pulse signal are, for example, but not limited to, the width of the pulse signal, the amplitude of the pulse signal, and so on.

Through this configuration, the data modulation module 112 can operate in the supply stage t1, the power stage t2, and the data stage t3, respectively, and realize multiple circuit functions through one circuit configuration, which can greatly simplify the circuit structure and save costs.

In other embodiments, the data modulation module 112 may only operate in one or two of the supply stage t1, the power stage t2, and the data stage t3. FIG. 5A is a schematic circuit diagram of a filtering circuit in accordance with the first embodiment of the present disclosure. The filtering circuit 116 includes a capacitor 1161. The first pin of the capacitor 1161 is electrically connected to the cathode of the diode 117, and the second pin of the capacitor 1161 is electrically connected to the circuit node REFD. The filtering circuit 116 filters the received power signal to generate a filtered signal.

Figure 5B:
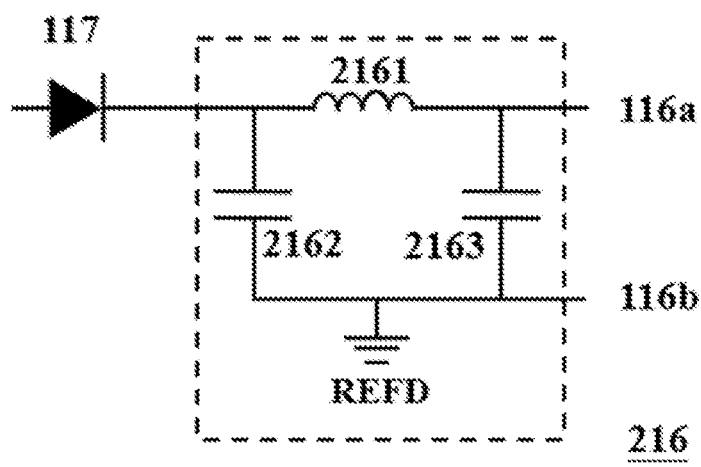
FIG. 5B is a schematic circuit diagram of a filtering circuit in accordance with the second embodiment of the present disclosure.

Refer to FIG. 5B for a schematic circuit diagram of a filtering circuit in accordance with the second embodiment of the present disclosure. The filtering circuit 216 includes an inductor 2161, a capacitor 2162, and a capacitor 2163. The first pin of the inductor 2161 is electrically connected to the cathode of the diode 117, and the second pin of the inductor 2161 is electrically connected to the filtering circuit output end 116a. The first pin of the capacitor 2162 is electrically connected to the first pin of the inductor 2161, and the second pin of the capacitor 2162 is electrically connected to the circuit node REFD. The first pin of the capacitor 2163 is electrically connected to the second pin of the inductor 2161, and the second pin of the capacitor 2163 is electrically connected to the circuit node REFD. The filtering circuit output end 116b is electrically connected to the circuit node REFD. The filtering circuit 216 is a π-type filtering circuit, which filters the received circuit signal to generate a filtered signal.

In other embodiments, the filtering circuit 116 can be implemented by other forms of filtering circuit structures, and the present disclosure is not limited thereto.

Figure 6A:
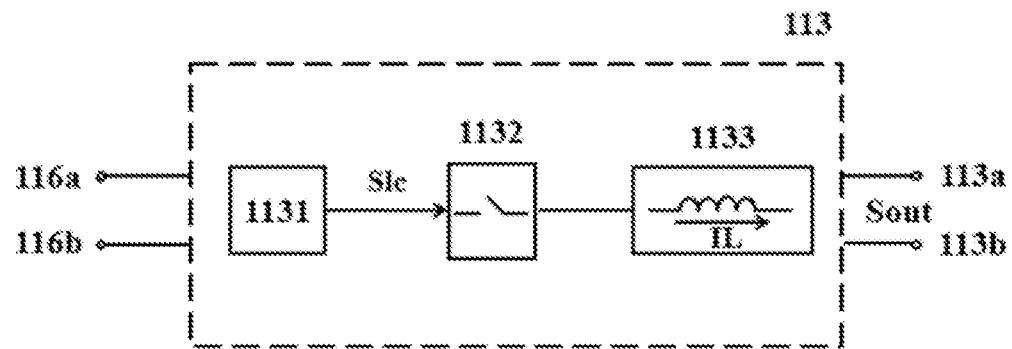
FIG. 6A is a schematic block diagram of a power supply module in accordance with the first embodiment of the present disclosure.

Refer to FIG. 6A for a schematic block diagram of a power supply module in accordance with the first embodiment of the present disclosure. The power supply module 113 includes a controller 1131, a switch circuit 1132, and an energy storage circuit 1133.

In this embodiment, the controller 1131 adjusts the control signal Slc based on the output signal Sout of the output end of the power supply module, the switch circuit 1132 is conducted or cut-off in response to the control signal Slc of the controller 1131, and the energy storage circuit 1133 would be charged/discharged iteratively based on the conducted/cut-off state of the switch circuit, such that the output signal Sout of the power supply module is stabilized at a preset value. Based on this, power conversion can be realized by the power supply module 113 to convert the received power signal into a stable power supply module output signal Sout.

Figure 6B:
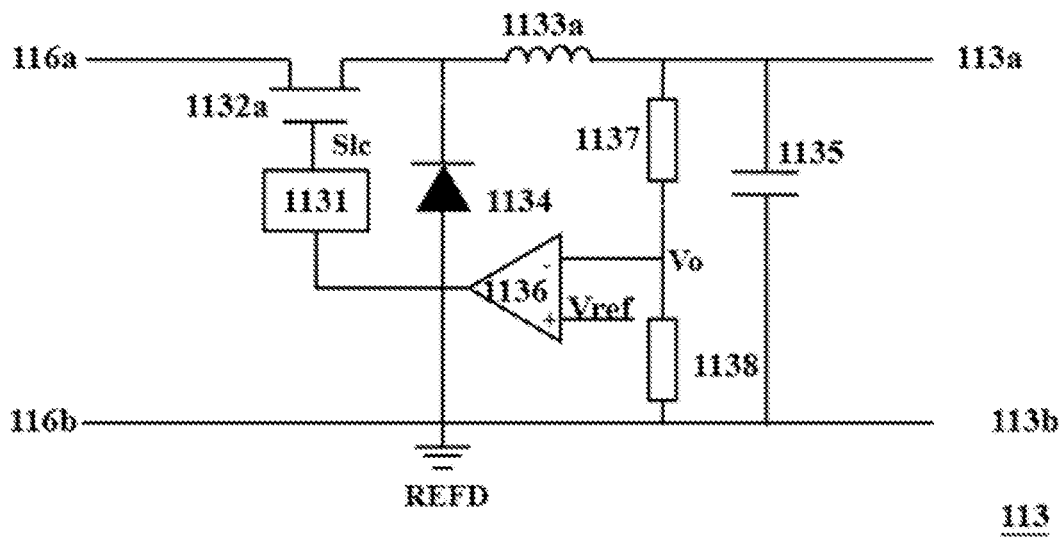
FIG. 6B is a schematic diagram of a circuit structure of a power supply module in accordance with the first embodiment of the present disclosure.

Refer to FIG. 6B for a schematic diagram of a circuit structure of a power supply module in accordance with the first embodiment of the present disclosure. The power supply module 113 includes a controller 1131, a switch circuit 1132, an energy storage circuit 1133, a diode 1134, a capacitor 1135, an operational amplifier 1136, a first resistor 1137, and a second resistor 1138. In this embodiment, the switch circuit 1132 includes a transistor 1132a, and the energy storage circuit 1133 includes an inductor 1133a. The second pin of the transistor 1132a is electrically connected to the filtering circuit output end 116a, the third pin of the transistor 1132a is electrically connected to the first pin of the inductor 1133a, and the first pin of the transistor 1132a is electrically connected to the controller 1131. The second pin of the inductor 1133a is electrically connected to the power supply circuit output end 113a. The cathode of the diode 1134 is electrically connected to the first pin of the inductor 1133a, and the anode of the diode 1134 is electrically connected to the filtering circuit output end 116b. The first pin of the resistor 1137 is electrically connected to the second pin of the inductor 1133a, and the second pin of the resistor 1137 is electrically connected to the first pin of the resistor 1138. The second pin of the resistor 1138 is electrically connected to the power supply circuit output end 113b. The first pin of the capacitor 1135 is electrically connected to the second pin of the inductor 1133a, and the second pin of the capacitor 1135 is electrically connected to the power supply module output end 113b. The inverting input end of the operational amplifier 1136 is electrically connected to the second pin of the resistor 1137, the non-inverting input end of the operational amplifier 1136 is electrically connected to the reference voltage Vref, and the output end of the operational amplifier 1136 is electrically connected to the controller 1131. The filtering circuit output end 116b is electrically connected to the power supply module output end 113b.

The circuit shown in this embodiment is a Buck-type power conversion circuit. The basic principle is that the inductor 1333a is configured as an energy storage circuit, the diode 1134 has unidirectional conductivity and is configured as a freewheeling diode in this embodiment, and the transistor 1132a is configured as a switch to realize switching of the circuit. In this embodiment, the transistor 1132a is implemented with a MOS transistor, and the present invention is not limited thereto.

Figure 6C:
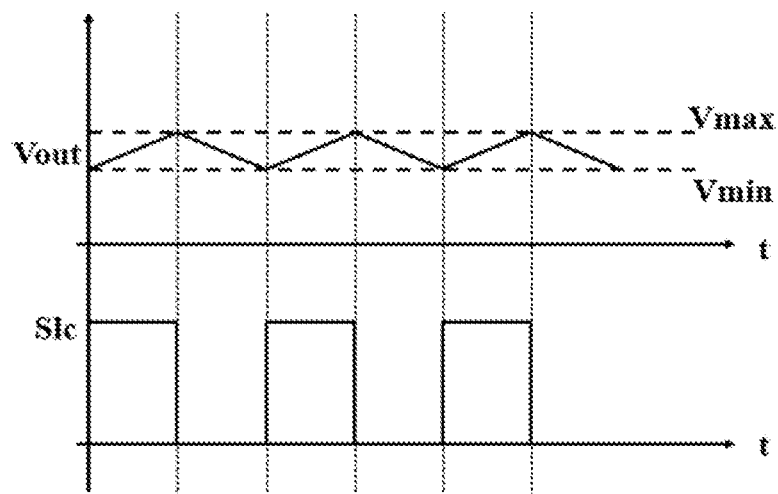
FIG. 6C is a schematic diagram of a signal waveform diagram of the power supply module in accordance with the first embodiment of the present disclosure.

Additionally refer to FIG. 6C for a schematic diagram of a signal waveform diagram of the power supply module in accordance with the first embodiment of the present disclosure. When Slc is at high level, the MOS transistor 1132a is conducted, and current can flow into next stage through the power supply module input end 125a, the MOS transistor 1132a, the inductor 1133a, and the power supply module output end 113a. Since the current of the inductor 1133a is not able to change suddenly, and the voltage across the capacitor 1135 is not able to change suddenly either, the voltage between the power supply module output ends 113a and 113b (i.e., Vout) would be increased gradually. When the voltage at the power supply module output end Vout exceeds a set threshold Vmax, the control signal Slc changes from high level to low level, and the MOS transistor 1132a is cut-off. At this time, the voltage at the power supply module output end Vout no longer rises. At this time, some energy is stored in the inductor 1133a and the capacitor 1135. The capacitor 1135 starts to discharge to the power supply module output end 113a and 113b. Similarly, the inductor 1133a discharges the power supply module output end 113a and 113b through the discharge loop formed by the power supply module output end 113a, the power supply module output end 113b, and the diode 1134, and the output voltage Vout of the power supply module begins to drop. When the voltage Vout at the power supply module output end 113a and 113b drops to a set threshold Vmin, the control signal Slc sent by the controller 1131 changes from low level to high level. In this way, the output voltage Vout of the power supply module can stabilize at the set thresholds Vmax and Vmin. When the difference between the set threshold Vmax and Vmin is small enough, the output voltage Vout of the power supply module can be approximately regarded as a constant voltage output.

In this embodiment, the operational amplifier 1136 collects the voltage value of the output end Vout of the power supply module, compares the voltage value with the set reference voltage Vref, and feeds back the comparison result to the controller 1131. The controller 1131 dynamically adjusts the control signal Slc based on the feedback result to ensure the output signal of the power supply module is a constant value. This kind of feedback mechanism that dynamically adjusts the output based on the output result is referred as negative feedback.

The resistor 1137 and the resistor 1138 are connected in series and electrically connected to the power supply module output end, and the common end of the resistor 1137 and the resistor 1138 is electrically connected to the inverting input end of the operational amplifier to collect the output voltage Vout of the power supply module. The voltage Vo is obtained after the output voltage Vout is divided by the resistor 1137 and the resistor 1138. The voltage Vo and the output voltage Vout of the power supply module are linearly proportional, so the voltage Vo can reflect the change of the output voltage Vout of the power supply module. The non-inverting input end of the operational amplifier is electrically connected to a reference voltage Vref. In this embodiment, the reference voltage Vref can be provided by devices such as TL431.

In this embodiment, the output voltage Vout of the power supply module satisfies the following relationship:

$$Vout = \frac{R1137 + R1138}{R1138} \times Vref \quad \text{(Equation 1)}$$

In the formula, R1137 is the resistance value of the resistor 1137, and R1138 is the resistance value of the resistor 1138.

Figure 7A:
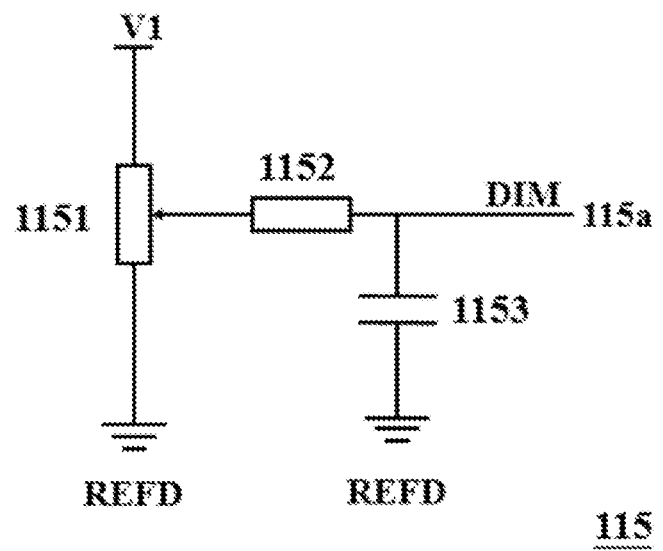
FIG. 7A is a schematic circuit diagram of a dimming signal generating module in accordance with the first embodiment of the present disclosure.

Refer to FIG. 7A for a schematic circuit diagram of a dimming signal generating module in accordance with the first embodiment of the present disclosure. The dimming signal generating module 115 includes a variable resistor 1151, a resistor 1152, and a capacitor 1153. The first pin of the variable resistor 1151 is electrically connected to the voltage source V1, the second pin of the variable resistor 1151 is connected to the circuit node REFD, and the third pin of the variable resistor 1151 is connected to the first pin of the resistor 1152. The first pin of the capacitor 1153 is electrically connected to the second pin of the resistor 1152, and the second pin of the capacitor 1153 is electrically connected to the circuit node REFD. The output end 115a of the dimming signal generating module 115 is electrically connected to the second pin of the resistor 1152. The voltage source V1 is configured to provide a constant voltage. In this embodiment, the variable resistor 1151 is a sliding rheostat. By changing the position of the third pin of the variable resistor 1151, the voltage of the third pin relative to the circuit node REFD can vary from 0 to V1, and the voltage change from 0 to V1 corresponds to the different brightness of the LED lamp. The voltage signal corresponding to the third pin of the variable resistor 1151 is the digital dimming signal DIM. The output end 115a of the dimming signal generating module 115 is electrically connected to the control module 114, and the digital dimming signal DIM is transmitted to the control module 114.

In other embodiments, the dimming signal generating module 114 can include a wireless remote control and a signal receiving module. The wireless remote control module is configured to convert the user-configured dimming information into a wireless dimming signal and the wireless dimming signal is transmitted to the signal receiving module. The signal receiving module receives the wireless dimming signal and converts the wireless dimming signal into a digital dimming signal DIM, wherein the digital dimming signal DIM includes configuration of brightness or color information.

In some embodiments, the dimming signal generating module can also include a light sensing module. The light sensor module is configured to receive ambient light and generating the digital dimming signal DIM based on the intensity of the ambient light. In this way, the function of automatically adjusting the brightness or color of the LED lamp based on the ambient light can be realized.

Figure 8A:
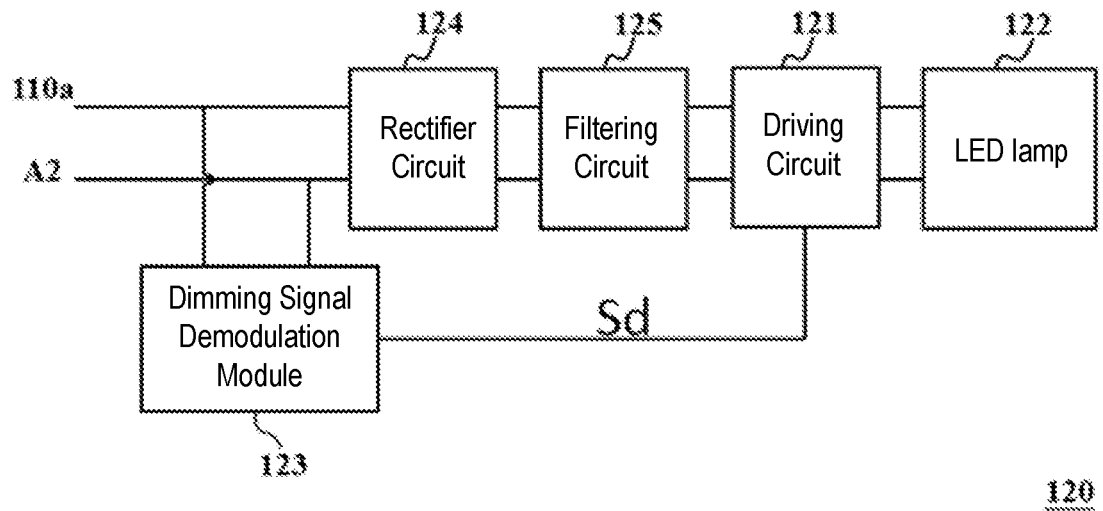
FIG. 8A is a schematic structure diagram of a LED lamp in accordance with the first embodiment of the present disclosure.

FIG. 8A is a schematic structure diagram of a LED lamp in accordance with the first embodiment of the present disclosure. The LED lamp 120 includes a driving circuit 121, an LED module 122, a dimming signal demodulation module 123, a rectifier circuit 124 and a filtering circuit 125. The dimming signal demodulation module 123 is electrically connected to the dimmer output end 110a and the power input end A2. The dimming power signal outputted by the dimmer 110 includes dimming information, and the dimming signal demodulation module 123 can demodulates the dimming information from the dimming power signal and converts the dimming information into a dimming driving signal Sd. The rectifier circuit 124 is electrically connected to the output end 110a of the dimmer 110 and the power input end A2 and is configured to receive the power signal in the dimming power signal and rectify the power signal to generate a rectified signal. The filtering circuit 125 is electrically connected to the rectifier circuit 124 to receive and filter the rectified signal to generate a filtered signal. The driving circuit 121 is electrically connected to the filtering circuit 125 to receive the filtered signal to light the LED module 122. The driving circuit 121 is electrically connected to the dimming signal demodulation circuit and is configured to receive the dimming driving signal Sd, and adjust the brightness of the LED module 122 based on the dimming driving signal Sd. The LED module 122 is electrically connected to the driving circuit 121 and is configured to receive a driving signal from the driving circuit 121 to be lighten up.

Figure 9A:
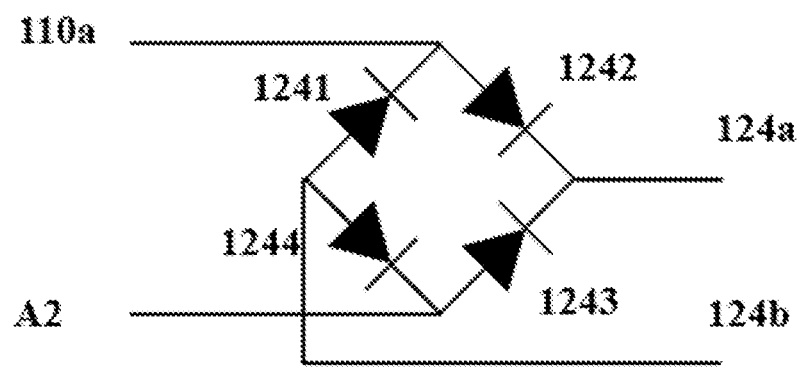
FIG. 9A is a schematic diagram of a circuit structure of a rectifier circuit in accordance with the first embodiment of the present disclosure.

Refer to FIG. 9A for a schematic diagram of a circuit structure of a rectifier circuit in accordance with the first embodiment of the present disclosure. The rectifier circuit 124 is a full-bridge rectifier circuit, and includes a diode 1241, a diode 1242, a diode 1243, and a diode 1244. The anode of the diode 1241 and the anode of the diode 1244 are connected and are connected to the output end 124b of the rectifier circuit 124, the cathode of the diode 1242 and the cathode of the diode 1243 are connected and are connected to the output end 124a of the rectifier circuit 124. The cathode of the diode 1241 and the anode of the diode 1242 are connected and are connected to the dimmer output end 110a, and the anode of the diode 1243 and the cathode of the diode 1244 are connected and are connected to the power signal input end A2.

When the signal input from the power signal input end A2 is an AC signal, the DC signal can be outputted after being rectified by the rectifier circuit 124. When the voltage level of the dimmer output end 110a is greater than the voltage level of the power signal input end A2, the signal would flow in through the dimmer output end 110a, the diode 1242, the output end 124a of the rectifier circuit 124, and flows out through the rectifier circuit output end 124b, the diode 1244 and the power signal input end A2. When the voltage level of the power signal input end A2 is greater than the voltage level of the dimmer output end 110a, the signal would flow in through the power signal input end A2, the diode 1243, the output end 124a of the rectifier circuit 124, and flow out through the rectifier circuit output end 124b, the diode 1241 and the dimmer output end 110a. Therefore, the voltage level of the rectifier circuit output end 124a would be always higher than the voltage level of the rectifier circuit output end 124b, and the rectifier circuit 124 can output a DC signal.

Figure 9B:
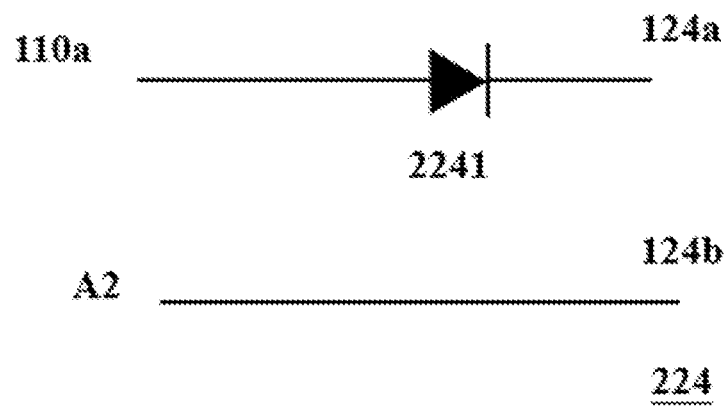
FIG. 9B is a schematic diagram of a circuit structure of a rectifier circuit in accordance with the second embodiment of the present disclosure.

Refer to FIG. 9B for a schematic diagram of a circuit structure of a rectifier circuit in accordance with the second embodiment of the present disclosure. The rectifier circuit 224 includes a diode 2241. The diode 2241 is connected in series between the dimmer output end 110a and the rectifier circuit output end 124a. The power input end A2 is electrically connected to the rectifier circuit output end 124b. When the voltage level of the dimmer output end 110a is higher than the voltage level of the power signal input end A2, the power signal flows in through the dimmer output end 110a, the diode 2241, and the rectifier circuit output end 124a, and flows out through the rectifier circuit output end 124b and the power signal input end A2; when the voltage level of the power signal input end A2 is higher than the voltage level of the dimmer output end 110a, a current path cannot be formed. Therefore, when the power signal is AC power, the rectifier circuit 211 only allows the positive half cycle of the power signal to pass and a half-wave rectified signal is obtained.

Figure 10A:
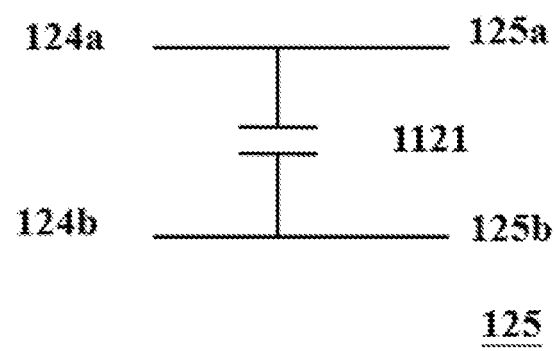
FIG. 10A is a schematic diagram of a circuit structure of a filtering circuit in accordance with the third embodiment of the present disclosure.

Refer to FIG. 10A for a schematic diagram of a circuit structure of a filtering circuit in accordance with the third embodiment of the present disclosure. The filtering circuit 125 includes a capacitor 1251. The first pin of the capacitor 1251 is electrically connected to the rectifier circuit output end 124a, and the second pin of the capacitor 1251 is electrically connected to the rectifier circuit output end to filter the received rectified signal and filter out the high frequency components in the rectified signal.

Figure 10B:
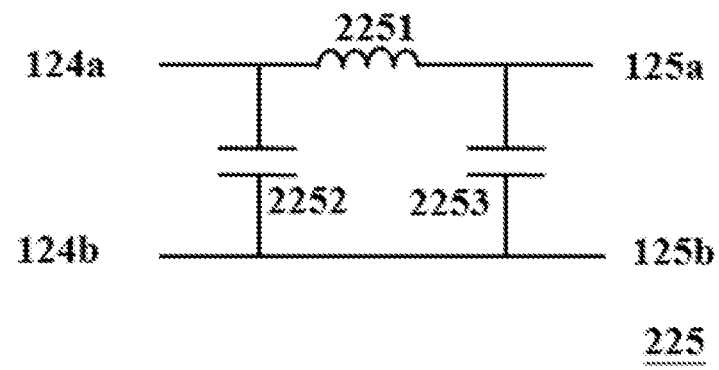
FIG. 10B is a schematic diagram of a circuit structure of a filtering circuit in accordance with the fourth embodiment of the present disclosure.

Refer to FIG. 10B for a schematic diagram of a circuit structure of a filtering circuit in accordance with the fourth embodiment of the present disclosure. The filtering circuit 225 includes an inductor 2251, a capacitor 2252, and a capacitor 2253. The first pin of the capacitor 2252 is electrically connected to the rectifier circuit output end 124a, and the second pin of the capacitor 2252 is electrically connected to the rectifier circuit output end 124b. The first pin of the capacitor 2253 is electrically connected to the filtering circuit output end 125a, and the second pin of the capacitor 2253 is electrically connected to the filtering circuit output end 125b. The first pin of the inductor 2251 is electrically connected to the rectifier circuit output end 124a, and the second pin of the inductor 2251 is electrically connected to the filtering circuit output end 125a. The filtering circuit 225 is a π-type filtering circuit.

The inductance value of the inductor 2251 in the above embodiment is preferably selected from the range of 10 nH-10 mH. The capacitance values of the capacitors 1251, 2252, and 2253 are preferably selected from the range of 100 pF to 1 μF.

Figure 11A:
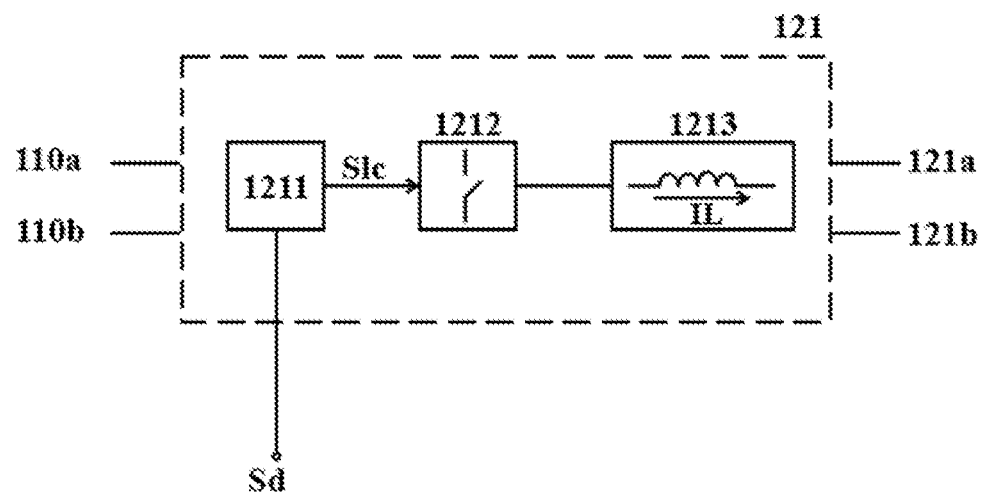
FIG. 11A is a schematic diagram of a circuit structure of a driving circuit in accordance with the first embodiment of the present disclosure.

Refer to FIG. 11A for a schematic diagram of a circuit structure of a driving circuit in accordance with the first embodiment of the present disclosure. The structure of the driving circuit 121 in this embodiment is similar to the circuit structure of the driving circuit 113 shown in FIG. 6A. The difference is that in this embodiment, the driving controller 1211 receives the dimming driving signal Sd, adjusts the driving output signal based on the dimming driving signal Sd to adjust the brightness of the LED module.

In this embodiment, the brightness of the LED module can be adjusted by adjusting the current of the driving output signal. In other embodiments, the brightness of the LED module can also be adjusted by adjusting the voltage of the drive 输出 signal or other parameters thereof. The present disclosure is not limited thereto.

What is claimed is:

1. A dimmer, connected in series with a power supply circuit, the dimmer comprising:
    an external power input end and an output end of the dimmer, configured to convert a dimming configuration information into a digital dimming signal and generate a dimming power signal by loading the digital dimming signal onto an external power signal in the form of changing a waveform of an AC power of mains electricity, wherein the external power input end is electrically connected to one end of the AC power of the mains electricity, and the dimmer output end is configured to output the dimming power signal;
    a dimming signal generating module, electrically connected to a control module, and configured to convert the dimming configuration information into the digital dimming signal;
    a zero-crossing detection module, electrically connected to the external power input end and the output end of the dimmer, configured to detect a zero-crossing point in the external power signal and generate a zero-crossing signal;
    a data modulation module, electrically connected to the external power input end, configured to rectify the external power signal to generate a rectified signal and load the digital dimming signal on the external power signal to generate the dimming power signal;
    a filtering circuit, electrically connected to the data modulation module, configured to receive the rectified signal, and perform filtering to generate a filtered signal;
    a power supply module, electrically connected to the filtering circuit, configured to receive the filtered signal, perform a power conversion, and generate a power supply signal to be supplied to the dimmer; and
    a control module, electrically connected to the zero-crossing detection module, configured to receive the zero-crossing signal, start a data modulation at a specific time period after crossing a zero-voltage point, and load the received digital dimming signal to the external power signal to generate the dimming power signal,
    wherein the specific time period is from T/4 to T/2 after crossing the zero-voltage point, and T is the period of the external power signal.

2. The dimmer of claim 1, wherein the dimming signal generating module comprises a wireless remote controller and a signal receiving module, and the wireless remote controller is configured to convert the dimming configuration information into a wireless dimming signal, and the signal receiving module is configured to receive the wireless dimming signal and convert the wireless dimming signal into the digital dimming signal.

3. The dimmer of claim 1, wherein the dimming signal generating module further comprises a light sensing module, and the light sensing module generates the digital dimming signal based on an intensity of ambient light.

4. The dimmer of claim 1, wherein:
    the dimming signal generating module comprises a first variable resistor, a first resistor and a first capacitor;
    a first pin of the first variable resistor is electrically connected to a first voltage source, a second pin of the first variable resistor is electrically connected to a ground end, and a third pin of the first variable resistor is electrically connected to a first pin of the first resistor; and
    a first pin of the first capacitor is electrically connected to a second pin of the first resistor and is electrically connected to the output end of the dimming signal generating module, and a second pin of the first capacitor is electrically connected to the ground end.

5. The dimmer of claim 1, further comprising a first diode, wherein an anode of the first diode is electrically connected to the data modulation module, and a cathode of the first diode is electrically connected to the filtering circuit.

6. The dimmer of claim 5, wherein the filtering circuit comprises a second capacitor, a first pin of the second capacitor is electrically connected to the cathode of the first diode, and a second pin of the second capacitor is electrically connected to the ground end.

7. The dimmer of claim 6, wherein the filtering circuit further comprises a third capacitor and a first inductor, a first pin of the first inductor is electrically connected to the cathode of the first diode, a second pin of the first inductor is electrically connected to a first pin of the third capacitor, and a second pin of the third capacitor is electrically connected to the ground end.

8. The dimmer of claim 1, wherein:
    the power supply module comprises a controller, a switch circuit, and an energy storage circuit;
    the controller generates a control signal, and the switch circuit is conducted/cut-off in response to the control signal, and the energy storage circuit is repeatedly charged/discharged based on the conducted/cut-off of the switch circuit.

9. The dimmer of claim 8, wherein:
    the power supply module further comprises a second diode, a fourth capacitor, an operational amplifier, a second resistor, and a third resistor, the switch circuit comprises a first transistor, and the energy storage circuit includes a second inductor;
    a second pin of the first transistor is electrically connected to a first output end of the filtering circuit, a third pin of the first transistor is electrically connected to a first pin of the second inductor, and a first pin of the first transistor is electrically connected to the controller;
    a second pin of the second inductor is electrically connected to a first output end of the power supply module, a cathode of the second diode is electrically connected to the first pin of the second inductor, and the anode of the second diode is electrically connected to a second output end of the filtering circuit;
    a first pin of the second resistor is electrically connected to the second pin of the second inductor, a second pin of the second resistor is electrically connected to a first pin of the third resistor, and a second pin of the third resistor is electrically connected to a second output end of the power supply module;

a first pin of the fourth capacitor is electrically connected to the second pin of the second inductor, and the second pin of the fourth capacitor is electrically connected to the second output end of the power supply module;

an inverting input end of the operational amplifier is electrically connected to the second pin of the second resistor, a non-inverting input end of the operational amplifier is electrically connected to a reference voltage, and an output end of the operational amplifier is electrically connected to the controller; and the second output end of the filtering circuit is electrically connected to the second output end of the power supply module.

10. The dimmer of claim 1, wherein the zero-crossing detection module comprises a fourth resistor, a fifth resistor, a sixth resistor, a seventh resistor, a fifth capacitor, a sixth capacitor, a first Zener diode and a second Zener diode; a first pin of the fourth resistor is electrically connected to the external power input end, a second pin of the fourth resistor is electrically connected to a first output end of the zero-crossing detection module, the first pin of the fifth resistor is electrically connected to the second pin of the fourth resistor, a second pin of the fifth resistor is electrically connected to a first circuit node, a first pin of the fifth capacitor is electrically connected to the second pin of the fourth resistor, a second pin of the fifth capacitor is electrically connected to the first circuit node, an anode of the first Zener diode is electrically connected to the first circuit node, and the cathode of the first Zener diode is electrically connected to the first output end of the zero-crossing detection module; and wherein a first pin of the sixth resistor is electrically connected to the output end of the dimmer, a second pin of the sixth resistor is electrically connected to a second output end of the zero-crossing detection module, a first pin of the seventh resistor is electrically connected to the second pin of the sixth resistor, a second pin of the seventh resistor is electrically connected to the first circuit node, a first pin of the sixth capacitor is electrically connected to the first pin of the sixth resistor, a second pin of the sixth capacitor is electrically connected to the first circuit node, an anode of the second Zener diode is electrically connected to the first circuit node, and a cathode of the second Zener diode is electrically connected to the second output end of the zero-crossing detection module.

11. The dimmer of claim 1, wherein the data modulation module comprises a third diode, a fourth diode, a third Zener diode, a second transistor, a third transistor and a fourth transistor; an anode of the third diode is electrically connected to the external power input end and a first pin of the second transistor, and the cathode of the third diode is electrically connected to a cathode of the fourth diode and a cathode of the third Zener diode;

wherein a second pin of the second transistor and a second pin of the third transistor are electrically connected and are further electrically connected to a first circuit node, and a third pin of the second transistor is electrically connected to the control module; and wherein a first pin of the third transistor is connected to an anode of the fourth diode and is electrically connected to the output end of the dimmer, the third pin of the third transistor is electrically connected to the control module; and a first pin of the fourth transistor is electrically connected to an anode of the third Zener diode, a second pin of the fourth transistor is electrically connected to a third pin of the third transistor, and the third pin of the fourth transistor is electrically connected to the control module.

12. The dimmer of claim 11, wherein the external power signal is a mains electricity alternating current, and within an alternating current half-wave, the data modulation module includes three working stages: a supply stage, power stage and a data stage.

13. The dimmer of claim 12, wherein, in the supply stage, the external power signal is provided as power supply to the dimmer, in the power stage, the external power signal is provided as power supply to an LED lamp, and in the data stage, the dimmer loads the digital dimming signal onto the external power signal to generate the dimming power signal.

14. The dimmer of claim 12, wherein, during the power supply state, the second transistor and the third transistor are in a cut-off state.

15. The dimmer of claim 12, wherein, during the power stage, the second transistor and the third transistor are in a conducting state.

16. The dimmer of claim 12, wherein, in the data stage, the second transistor and the third transistor are operated in an amplification region, and the fourth transistor is conducting intermittently.

17. An LED lamp, comprising:

a rectifier circuit, a filtering circuit, a driving circuit, an LED module and a dimming signal demodulation module, wherein the LED lamp is disposed with a first input end and a second input end;

wherein:

the first input end is electrically connected to an output end of a dimmer, and the second input end is electrically connected to an external power signal input end;

the rectifier circuit is electrically connected to the first input end and the second input end, and is configured to receive and rectify an external power signal to generate a rectified signal;

the filtering circuit is electrically connected to the rectifier circuit and is configured to receive and filter the rectified signal to generate a filtered signal;

the dimming signal demodulation module is electrically connected to the first input end and the second input end, and is configured to demodulate dimming information included in the external power signal and convert the dimming information into a dimming driving signal;

the driving circuit is electrically connected to the filtering circuit and the dimming signal demodulation module, and is configured to receive the filtered signal and perform a power conversion to generate a lighting signal, and to adjust the lighting signal based on the dimming driving signal; and the LED module is electrically connected to the driving circuit and is configured to receive the lighting signal to light up.

18. The LED lamp of claim 17, wherein the rectifier circuit is a full-bridge rectifier circuit.

19. The LED lamp of claim 18, wherein the rectifier circuit comprises a fifth diode, a sixth diode, a seventh diode and an eighth diode; an anode of the fifth and an anode of the sixth diode are electrically connected and are further electrically connected to a second output end of the rectifier circuit, a cathode of the seventh diode and a cathode of the eighth diode are electrically connected and are further electrically connected to a first output end of the rectifier circuit, a cathode of the fifth diode and an anode of the seventh diode are electrically connected and are further electrically connected to the first input end, and a cathode of the sixth diode and the anode of the eighth diode are electrically connected and are further electrically connected to the second input end.

20. The LED lamp of claim 17, wherein the filtering circuit comprises a seventh capacitor, a first pin of the seventh capacitor is electrically connected to the first output end of the rectifier circuit, and a second pin of the seventh capacitor is electrically connected to a second output end of the rectifier circuit.

21. The LED lamp of claim 20, wherein the filtering circuit further comprises an eighth capacitor and a third inductor; a first pin of the third inductor is electrically connected to the first pin of the seventh capacitor, a second pin of the third inductor and a first pin of the eighth capacitor are electrically connected and are further electrically connected to the first output end of the filtering circuit, and a second pin of the eighth capacitor and a second pin of the seventh capacitor are electrically connected and are further electrically connected to the second output end of the filtering circuit.

22. The LED lamp of claim 17, wherein:
the driving circuit comprises a controller, a switch circuit, and an energy storage circuit; and
the controller generates a control signal, the switch circuit is conducted/cut-off in response to the control signal, and the energy storage circuit is repeatedly charged/discharged based on the conducted/cut-off of the switch circuit.

23. An LED lamp lighting system comprising:
a dimmer, connected in series with a power supply circuit, the dimmer comprising:
an external power input end and an output end of the dimmer, configured to convert a dimming configuration information into a digital dimming signal and generate a dimming power signal by loading the digital dimming signal onto an external power signal in the form of changing a waveform of an AC power of mains electricity, wherein the external power input end is electrically connected to one end of the AC power of the mains electricity, and the dimmer output end is configured to output the dimming power signal,
wherein the external power input end of the dimmer is electrically connected to one end of the mains electricity alternating current; and
an LED lamp, comprising:
a rectifier circuit, a filtering circuit, a driving circuit, an LED module and a dimming signal demodulation module, wherein the LED lamp is disposed with a first input end and a second input end;
wherein:
the first input end is electrically connected to an output end of the dimmer, and the second input end is electrically connected to an external power signal input end;
the rectifier circuit is electrically connected to the first input end and the second input end, and is configured to receive and rectify an external power signal to generate a rectified signal;
the filtering circuit is electrically connected to the rectifier circuit and is configured to receive and filter the rectified signal to generate a filtered signal;
the dimming signal demodulation module is electrically connected to the first input end and the second input end, and is configured to demodulate dimming information included in the external power signal and convert the dimming information into a dimming driving signal;
the driving circuit is electrically connected to the filtering circuit and the dimming signal demodulation module, and is configured to receive the filtered signal and perform a power conversion to generate a lighting signal, and to adjust the lighting signal based on the dimming driving signal; and
the LED module is electrically connected to the driving circuit and is configured to receive the lighting signal to light up,
wherein the second input end of the LED lamp is electrically connected to another end of the mains electricity alternating current.

24. The LED lamp lighting system of claim 23, wherein the LED lamp lighting system comprises a plurality of LED lamps, and the plurality of LED lamps are connected in parallel.

\* \* \* \* \*